United States Patent
Nakashima

(10) Patent No.: US 7,759,658 B2
(45) Date of Patent: Jul. 20, 2010

(54) ION IMPLANTING APPARATUS

(75) Inventor: Yoshiki Nakashima, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 12/418,948

(22) Filed: Apr. 6, 2009

(65) Prior Publication Data

US 2009/0256082 A1    Oct. 15, 2009

(30) Foreign Application Priority Data

Apr. 10, 2008  (JP) ............................ 2008-102694

(51) Int. Cl.
*H01J 37/317* (2006.01)
*H01J 37/12* (2006.01)
*H01J 3/14* (2006.01)

(52) U.S. Cl. .................. 250/492.21; 250/492.3; 250/396 R; 313/360.1; 313/361.1

(58) Field of Classification Search ............ 250/492.21, 250/396 R, 492.3; 313/360.1, 361.1
See application file for complete search history.

(56) References Cited

U.S. PATENT DOCUMENTS

2005/0082498 A1 *  4/2005  White .................... 250/492.21
2009/0206270 A1 *  8/2009  Glayish et al. ......... 250/396 ML

FOREIGN PATENT DOCUMENTS

JP         11-354064       12/1999
JP         2008-34360      2/2008

* cited by examiner

*Primary Examiner*—Nikita Wells
(74) *Attorney, Agent, or Firm*—Osha • Liang LLP

(57) ABSTRACT

An ion implanting apparatus is provided. The ion implanting apparatus includes a beam scanner, a beam collimator and a unipotential lens which is disposed between said beam scanner and said beam collimator, and which includes first, second, third, and fourth electrodes arranged in an ion beam traveling direction while forming first, second, and third gaps, said first and fourth electrodes being electrically grounded, wherein positions of centers of curvature of said first and third gaps of said unipotential lens coincide with a position of a scan center of said beam scanner, and wherein a position of a center of curvature of said second gap of said unipotential lens is shifted from the position of the scan center of said beam scanner toward a downstream or upstream side in the ion beam traveling direction.

8 Claims, 21 Drawing Sheets

FIG. 21
$V_1 > V_2$
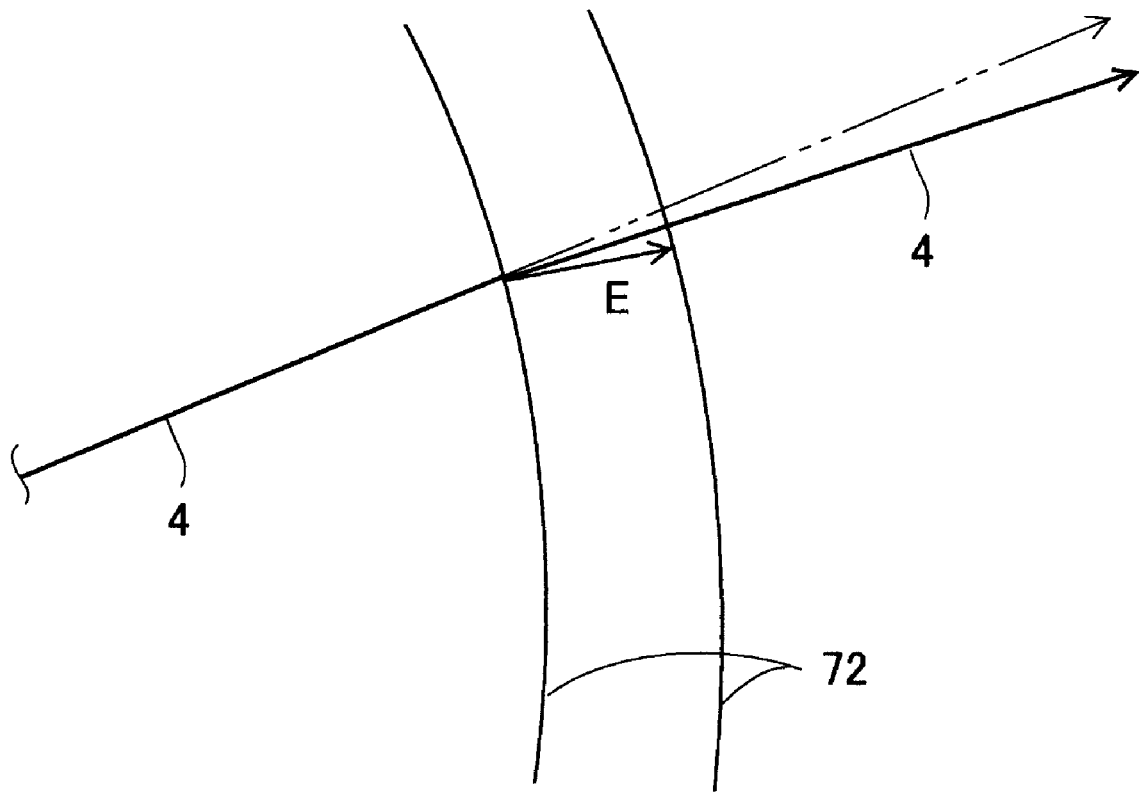
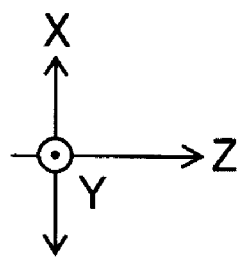

ION IMPLANTING APPARATUS

FIELD OF THE INVENTION

The present disclosure relates to an ion implanting apparatus including a unipotential lens (also referred to as an einzel lens) which narrows a scanned ion beam.

DESCRIPTION OF RELATED ART

For example, Japanese Unexamined Patent Publication JP-A-2008-34360 describes a related art ion implanting apparatus. The related art ion implanting apparatus will be described with reference to FIG. 1.

As shown in FIG. 1, a traveling direction of an ion beam 4 is set as the Z direction, and two directions which are substantially orthogonal to each other in a plane that is substantially orthogonal to the traveling direction Z are set as X and Y directions, respectively. For example, the X and Z directions are horizontal directions, and the Y direction is a vertical direction.

The ion beam 4 generated from an ion source 2 is mass-separated by a mass analyzer 6, accelerated or decelerated by an accelerating/decelerating column 8, energy separated by an energy separator 10, scanned in the X direction by a beam scanner 12, and bent by a beam collimator 14 so as to be substantially parallel to a predetermined reference axis 16 in an XZ plane (a plane formed by the X and Z directions, the same shall apply hereinafter), to be formed into a parallel beam. The ion beam 4 emitted from the beam collimator 14 passes through a beam shaping mask 20 having a rectangular opening 22 in which the long side extends in the X direction and the short side extends in the Y direction, to be shaped, and then irradiates a target (for example, a semiconductor substrate) 24 held by a holder 26, thereby implanting ions into the target 24.

The target 24 is mechanically scanned (reciprocally driven) together with the holder 26 by a target driving apparatus 28 in a direction (for example, the Y direction) intersecting with the XZ plane in an irradiation region of the ion beam 4 from the beam collimator 14.

A unipotential lens 30 which functions to narrow the ion beam 4 in the Y direction without changing the energy of the ion beam 4 is disposed on a downstream side of the beam collimator 14. More specifically, the unipotential lens 30 is disposed between the beam collimator 14 and the beam shaping mask 20. The unipotential lens 30 has an inlet electrode 31, an intermediate electrode 32, and an outlet electrode 33.

The ion beam 4 is narrowed in the Y direction by the unipotential lens 30, so that the divergence in the Y direction is suppressed by the space charge effect of the ion beam 4 and the like without changing the energy of the ion beam 4, and the rate at which the ion beam 4 is cut by the beam shaping mask 20 and the like is reduced, whereby the efficiency of transport of the ion beam 4 to the target 24 can be enhanced.

In JP-A-2008-34360, the unipotential lens 30 is disposed in the downstream side of the beam collimator 14. In order to narrow the ion beam 4 in the upstream side, alternatively, it may be contemplated that, in place of the unipotential lens 30, a unipotential lens 30a is disposed between the beam scanner 12 and the beam collimator 14 as indicated by the chain double-dashed lines in FIG. 1.

Alternatively, a related art unipotential lens may be configured similarly to an accelerating column disclosed in Japanese Unexamined Patent Publication JP-A-11-354064.

In JP-A-11-354064, the related art accelerating column is disposed between an electrostatic deflector which scans an ion beam, and a sector electromagnet which forms the scanned ion beam into a parallel beam, The center of curvature of an arcuate electrode of the accelerating column coincides with the center of deflection of the electrostatic deflector, so that the angle of ions incident on a substrate is kept constant irrespective of the scan angle of the electrostatic deflector and the like.

Therefore, electrode 31 to 33 constituting the unipotential lens 30a are formed into concentric arcuate shapes as an example indicated by the chain double-dashed lines in FIG. 1, so that the positions of the centers of curvature of the electrodes are made coincident with the position of the scan center 12a of the beam scanner 12 (the center of the scan of the ion beam 4 in the beam scanner 12, the same shall apply hereinafter). According to the configuration, in the unipotential lens 30a, with respect to the ion beam 4 at any scan position (scan angle), an electric field which exerts a function of bending the ion beam in the XZ plane is not produced theoretically. Therefore, the ion beam 4 can be narrowed in the Y direction without bending the orbit of the ion beam 4 in the XZ plane, by the unipotential lens 30a.

The related art ion implanting apparatus has a number of disadvantages, more specifically, in the unipotential lens 30a according to the related art, when a large assembly or production error exists in the electrodes constituting the lens, an electric field which exerts a function of bending the ion beam in the XZ plane is produced, and an orbit of the ion beam 4 in the XZ plane is deviated. Thus, the ion beam does not become incident on the beam collimator along the correct orbit. In the beam collimator, therefore, there is a disadvantage in that the function of forming the ion beam into a parallel beam is impaired, and the parallelism of the ion beam derived from the beam collimator is lowered. However, JP-A-11-354064 does not disclose any techniques for correcting such orbit deviation of the ion beam 4.

SUMMARY OF INVENTION

Illustrative aspects of the invention provide an ion implanting apparatus in which an orbit deviation of the ion beam can be corrected.

According to a first illustrative aspect of the invention, an ion implanting apparatus is provided with a beam scanner, a beam collimator, a unipotential lens which is disposed between said beam scanner and said beam collimator, and which has first, second, third and fourth electrodes arranged in an ion beam traveling direction while forming first, second and third gaps, said first and fourth electrodes being electrically grounded, and a voltage-variable DC power source, wherein positions of centers of curvature of said first and third gaps of said unipotential lens coincide with a position of a scan center of said beam scanner, and wherein a position of a center of curvature of said second gap of said unipotential lens is shifted from the position of the scan center of said beam scanner toward a downstream or upstream side in the ion beam traveling direction.

BRIEF DESCRIPTION OF THE DRAWINGS

FIG. 21 is a view exaggeratingly showing an example of equipotential lines and a state of an ion beam in the XZ plane in the vicinity of the second gap in the case where the position of the center of curvature of the second gap is shifted from the position of the scan center of a beam scanner toward the upstream side, and V1>V2.

DETAILED DESCRIPTION OF EXEMPLARY EMBODIMENTS

Figure 1:
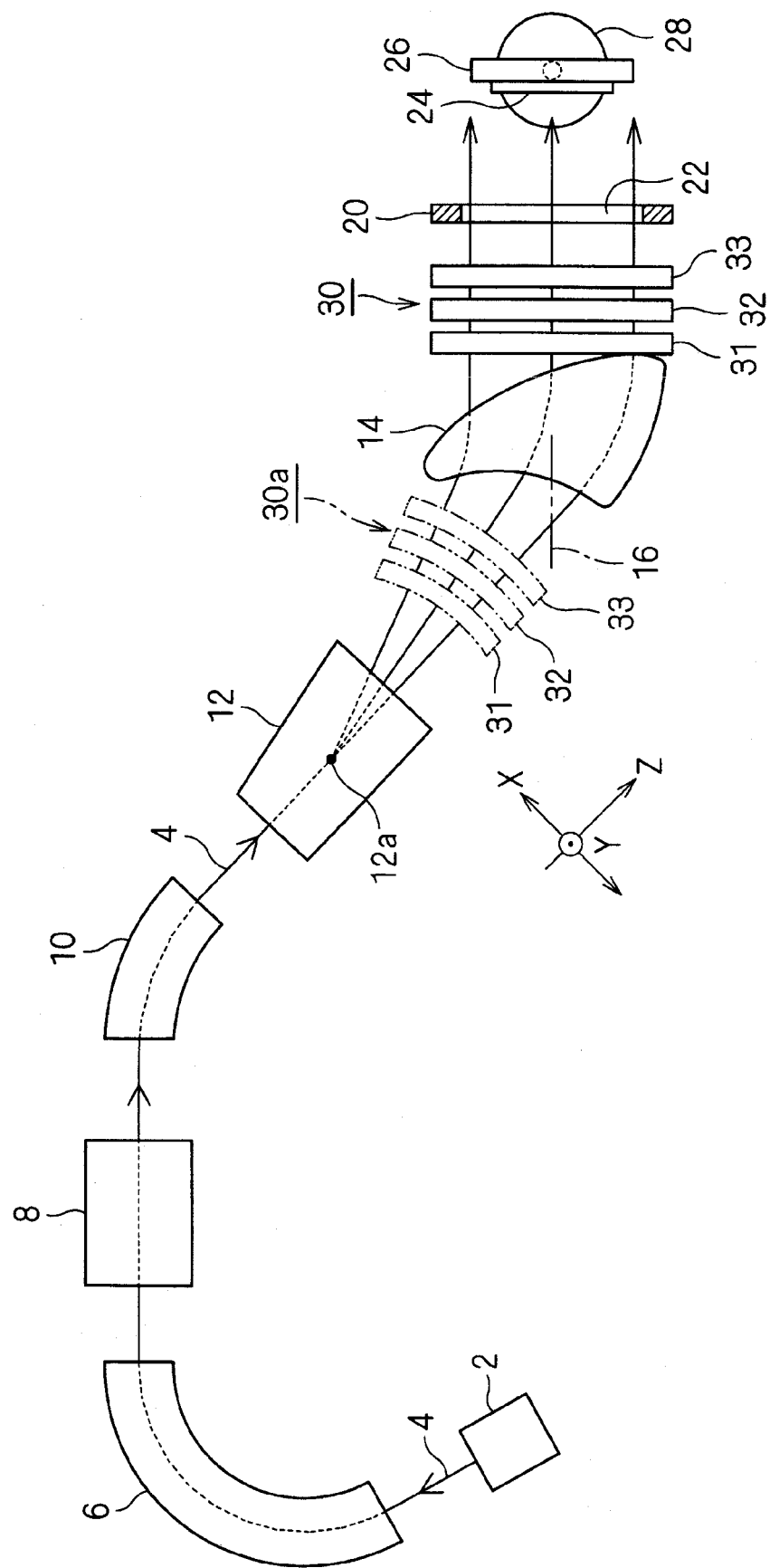
FIG. 1 is a schematic plan view showing a related-art ion implanting apparatus.
Figure 2:
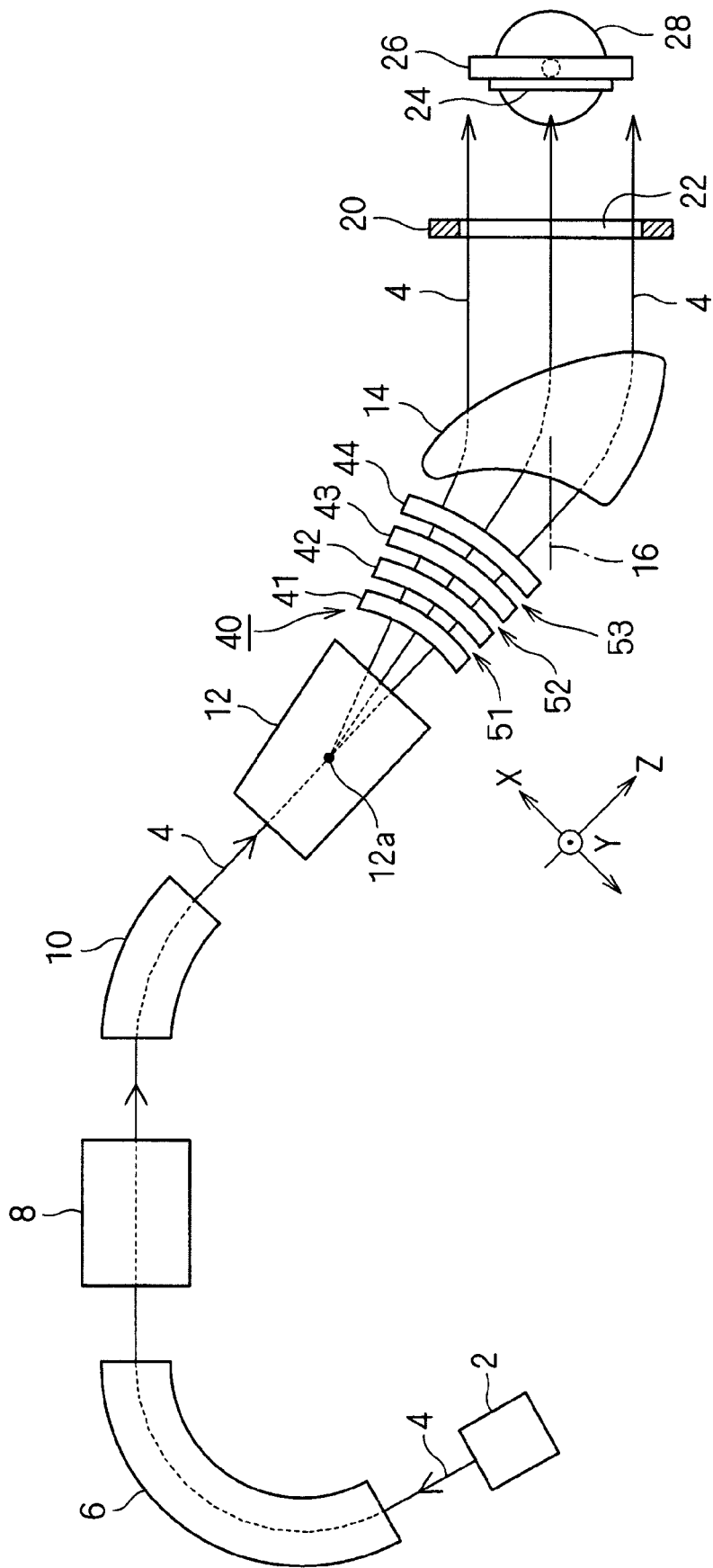
FIG. 2 is a schematic plan view showing an exemplary embodiment of an ion implanting apparatus of the invention.
Figure 3:
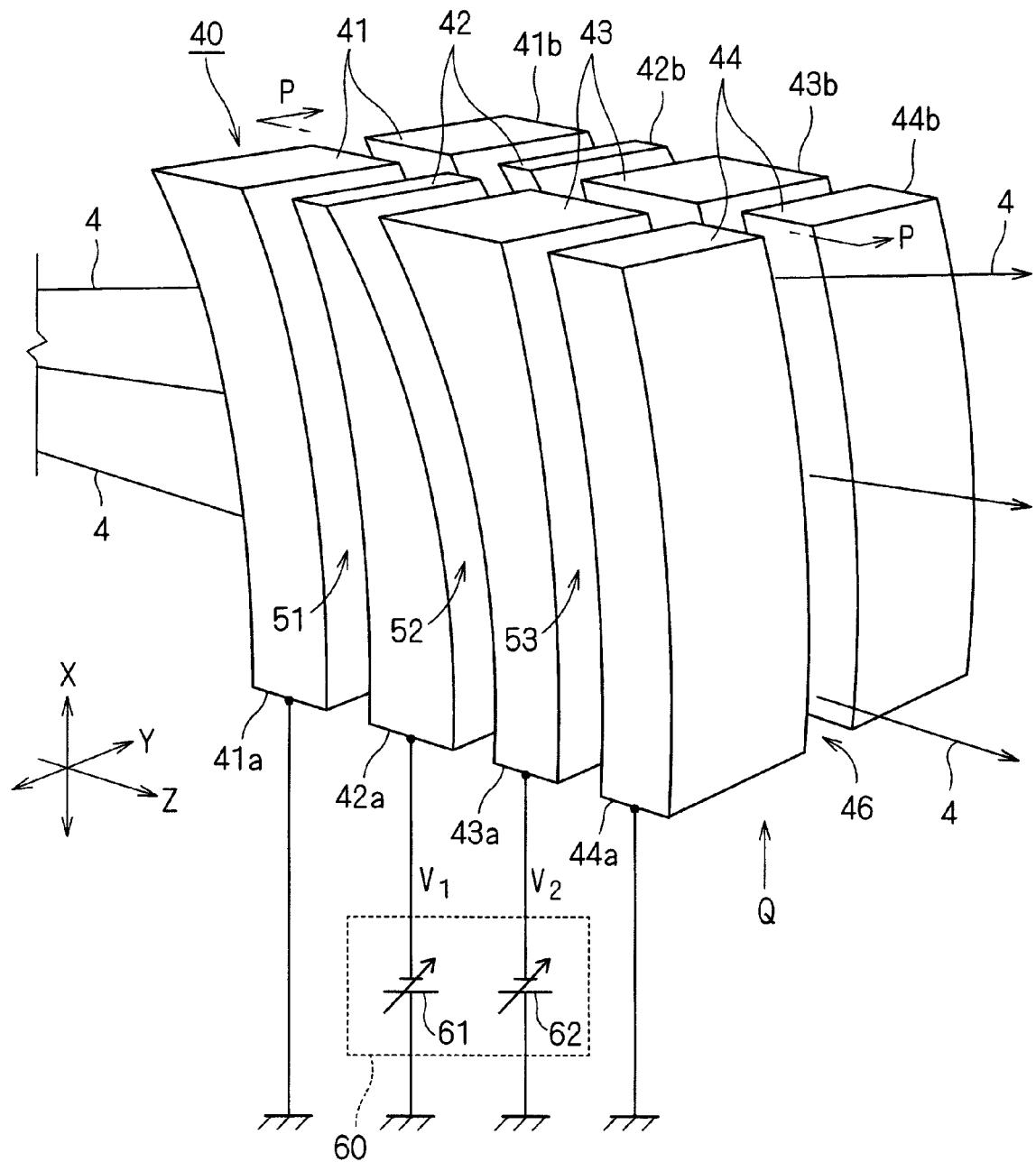
FIG. 3 is a perspective view enlargedly showing a vicinity of a unipotential lens in FIG. 2, together with a power source.

FIG. 2 is a schematic plan view showing an exemplary embodiment of an ion implanting apparatus of the invention. FIG. 3 is a perspective view enlargedly showing the vicinity of a unipotential lens of FIG. 2, together with a power source. In the drawings, like features are denoted by the same reference numerals.

As shown in FIGS. 2 and 3, an unipotential lens 40 having the following configuration is disposed between a beam scanner 12 and a beam collimator 14.

The unipotential lens 40 functions to narrow an ion beam passing therethrough, in the Y direction, and has a first electrode 41, second electrode 42, third electrode 43, and fourth electrode 44 that are arranged in the ion beam traveling direction Z while forming a first gap 51, second gap 52, and third gap 53 each of which have an arcuate shape in the XZ plane.

In the exemplary embodiment, as shown in FIG. 3, the first electrode 41, the second electrode 42, the third electrode 43, and the fourth electrode 44 are configured by pairs of electrodes 41a, 41b, electrodes 42a, 42b, electrodes 43a, 43b, and electrodes 44a, 44b, respectively. Each pair of electrodes are opposed to each other in the Y direction across a space 46 through which the ion beam 4 passes, and are at the same potential. In other words, electrodes 41a, 41b are at the same potential, and electrode 42a, 42b are at the same potential. Each pair of electrodes may be at a different potential. Thus, electrodes 42a, 42b may be at a different potential of electrodes 41a, 41b. In each of the pairs of electrodes 41a, 41b, electrodes 42a, 42b, electrodes 43a, 43b, and electrodes 44a, 44b, the paired electrodes are electrically connected to each other by a conductor (not shown). In place of the configuration described above, however, each of the pairs of the electrode may be configured by an integral electrode where a space through which the ion beam 4 passes is formed.

The first electrode 41 and the fourth electrode 44 are electrically grounded.

The ion implanting apparatus further includes a voltage-variable DC power source 60 which applies a first DC voltage $V_1$ and a second DC voltage $V_2$ to the second electrode 42 and the third electrode 43, respectively. In this exemplary embodiment, the DC power source 60 has a first DC power source 61 which applies the first DC voltage $V_1$ to the second electrode 42, and a second DC power source 62 which applies the second DC voltage $V_2$ to the third electrode 43. Alternatively, a single voltage-variable DC power source may output the two DC voltages $V_1$, $V_2$.

Even when the two DC voltages $V_1$, $V_2$ are positive, the unipotential lens 40 can function to narrow the ion beam 4 passing therethrough, in the Y direction. However, it is advantageous to set the two DC voltages $V_1$, $V_2$ to be negative as in the embodiment. When the two DC voltages $V_1$, $V_2$ are set to be negative, it is possible to prevent electrons in a drift space in which an electric field does not exist (for example, a space which is on the upstream side of the first electrode 41 and on the downstream side of the fourth electrode 44) from being pulled to the second electrode 42 and the third electrode 43. Therefore, divergence of the ion beam 4 due to the space charge effect can be prevented from being enhanced, by preventing from being pulled the electrons.

In this exemplary embodiment, in the electrodes 41 to 44, more specifically, the electrodes 41a, 41b, 42a, 42b, 43a, 43b,

44a, 44b constituting the electrodes 41 to 44, the faces facing the space 46 through which the ion beam 4 passes are substantially parallel to the XZ plane.

In this exemplary embodiment, the electrodes 41 to 44, more specifically, the electrodes 41a, 41b, 42a, 42b, 43a, 43b, 44a, 44b constituting the electrodes 41 to 44 have a shape which is arcuately curved in the XZ plane, so as to form the arcuate gaps 51 to 53, respectively.

Figure 4:
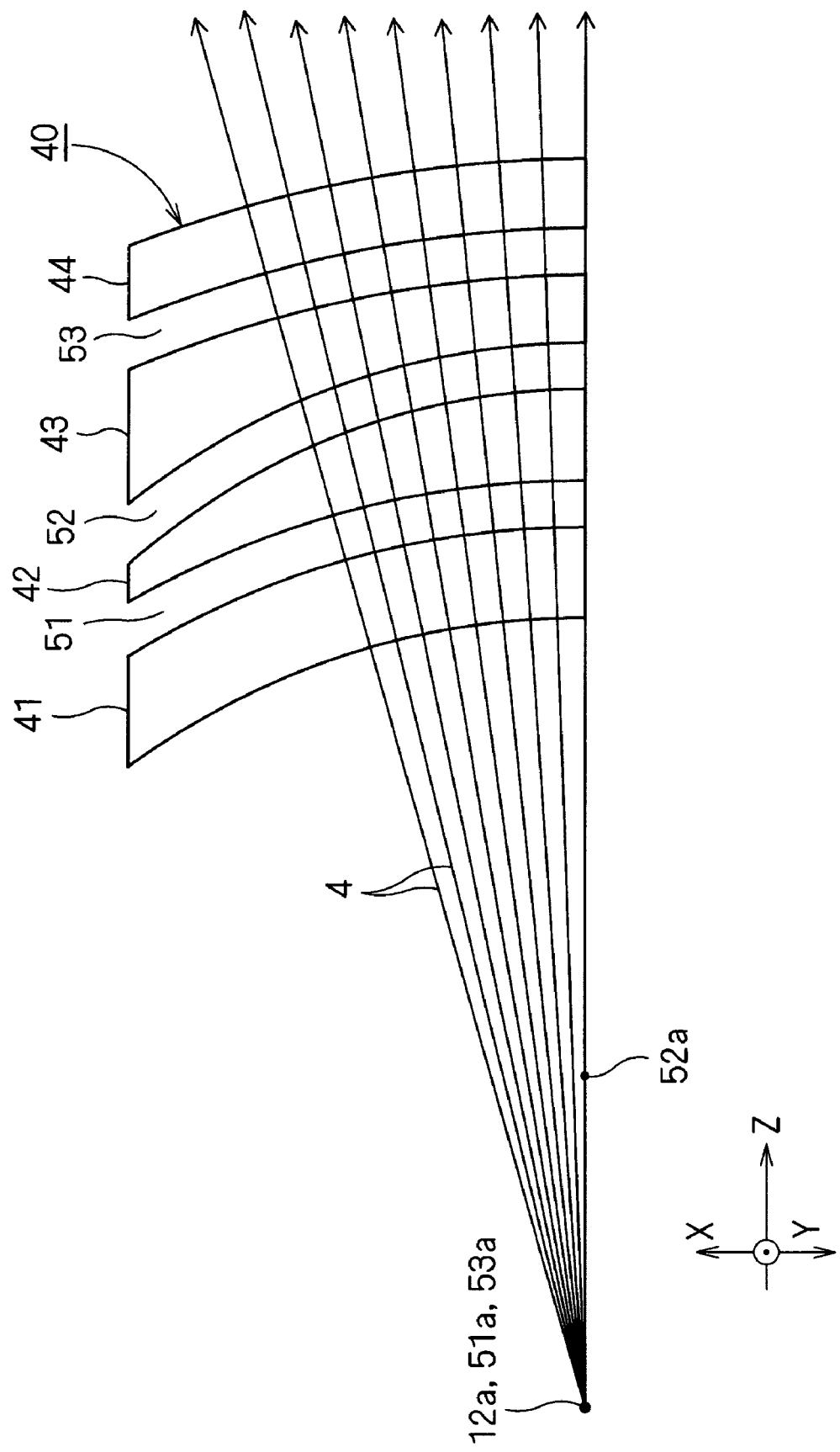
FIG. 4 is an XZ plan view showing an example of a state where a voltage is not applied to the unipotential lens shown in FIG. 3, as seen in the direction of the arrow P in FIG. 3.

Referring also to FIG. 4, the positions of centers 51a, 53a of curvature of the first and third gaps 51, 53, respectively, substantially coincide with a position of a scan center 12a of the beam scanner 12. In this exemplary embodiment, the position of the center 52a of curvature of the second gap 52 is shifted from the position of the scan center 12a of the beam scanner 12 toward the downstream side in the ion beam traveling direction Z. Therefore, the curvature of the second gap 52 is larger than the curvatures of the first and third gaps 51, 53. In other words, the radius of curvature of the second gap 52 is smaller than the radii of curvature of the first and third gaps 51, 53. Alternatively, the position of the center 52a of curvature of the second gap 52 may be shifted from the position of the scan center 12a of the beam scanner 12 toward the upstream side in the ion beam traveling direction Z. An example of this alternative configuration will be described later.

Although results of a simulation will be described later, in the unipotential lens 40, both end electrodes in the ion beam traveling direction Z, i.e., the first and fourth electrodes 41, 44 are kept to the same potential (specifically, the ground potential). The DC voltages $V_1$, $V_2$ are applied from the DC power source 60 to the second and third electrodes 42, 43. Therefore, the ion beam 4 can be narrowed in the Y direction without changing the energy of the ion beam 4. Without changing the energy of the ion beam 4, consequently, divergence of the ion beam 4 in the Y direction due to the space charge effect of the ion beam 4 and the like is suppressed, and the rate at which the ion beam 4 is cut by the beam shaping mask 20, the interior of the beam collimator 14, and the like is reduced, whereby the efficiency of transport of the ion beam 4 to a target 24 can be enhanced.

Furthermore, at least one of the first and second DC voltages $V_1$, $V_2$ which are applied from the DC power source 60 to the second and third electrodes 42, 43, respectively, of the unipotential lens 40 is adjusted, whereby the electric field in the second gap 52 of the unipotential lens 40 is adjusted, so that the orbit of the ion beam 4 in the XZ plane which has passed through the second gap can be changed. This change in orbit is caused by the following reasons. As described above, the position of the center 52a of curvature of the second gap 52 is shifted from the position of the scan center 12a of the beam scanner 12 toward the downstream side in the ion beam traveling direction Z. In the XZ plane, therefore, an angle can be formed between the direction of the electric field in the second gap 52 and the traveling direction of the ion beam 4.

Therefore, an orbit deviation of the ion beam 4 in the XZ plane caused by an assembly error, a production error, and the like of the electrodes constituting the unipotential lens 40 can be electrically corrected by the unipotential lens 40. As a result, even when, for example, an assembly or production error exists in the electrode constituting the unipotential lens 40, the ion beam 4 can be incident on the beam collimator 14 along its correct orbit. Therefore, it is possible to prevent a situation where the function in which the ion beam 4 is formed into a parallel beam by the beam collimator 14 is impaired, and the parallelism of the ion beam 4 derived from the beam collimator 14 is lowered.

As described above, the position of the center 51a of curvature of the first gap 51, and that of the center 53a of curvature of the third gap 53 substantially coincide with that of the scan center 12a of the beam scanner 12. Therefore, in principle, with respect to the ion beam 4 at any scan position (scan angle), an angle is not formed in the XZ plane between the directions of the electric fields in the gaps 51, 53 and the traveling direction of the ion beam 4. Even when electric fields are produced in the gaps 51, 53 in order to narrow the ion beam 4 in the Y direction, therefore; the orbit of the ion beam 4 in the XZ plane is not changed by the electric field.

FIGS. 4 to 17 show examples of results of simulations of the orbit of the ion beam 4 which passes through the unipotential lens 40. FIGS. 4 to 17 show examples in a case where the ion beam 4 which is scanned in the X direction in the XZ plane by the above-described beam scanner 12 (the scan center is the position 12a), and which is substantially parallel in the XZ plane (i.e., the divergence angle in the Y direction is approximately 0 deg.) is incident on the unipotential lens 40 (more specifically, the space 46 of the lens). In the examples shown in FIGS. 4 to 17, the ion beam 4 is an argon ion beam having energy of 10 keV.

Figure 5:
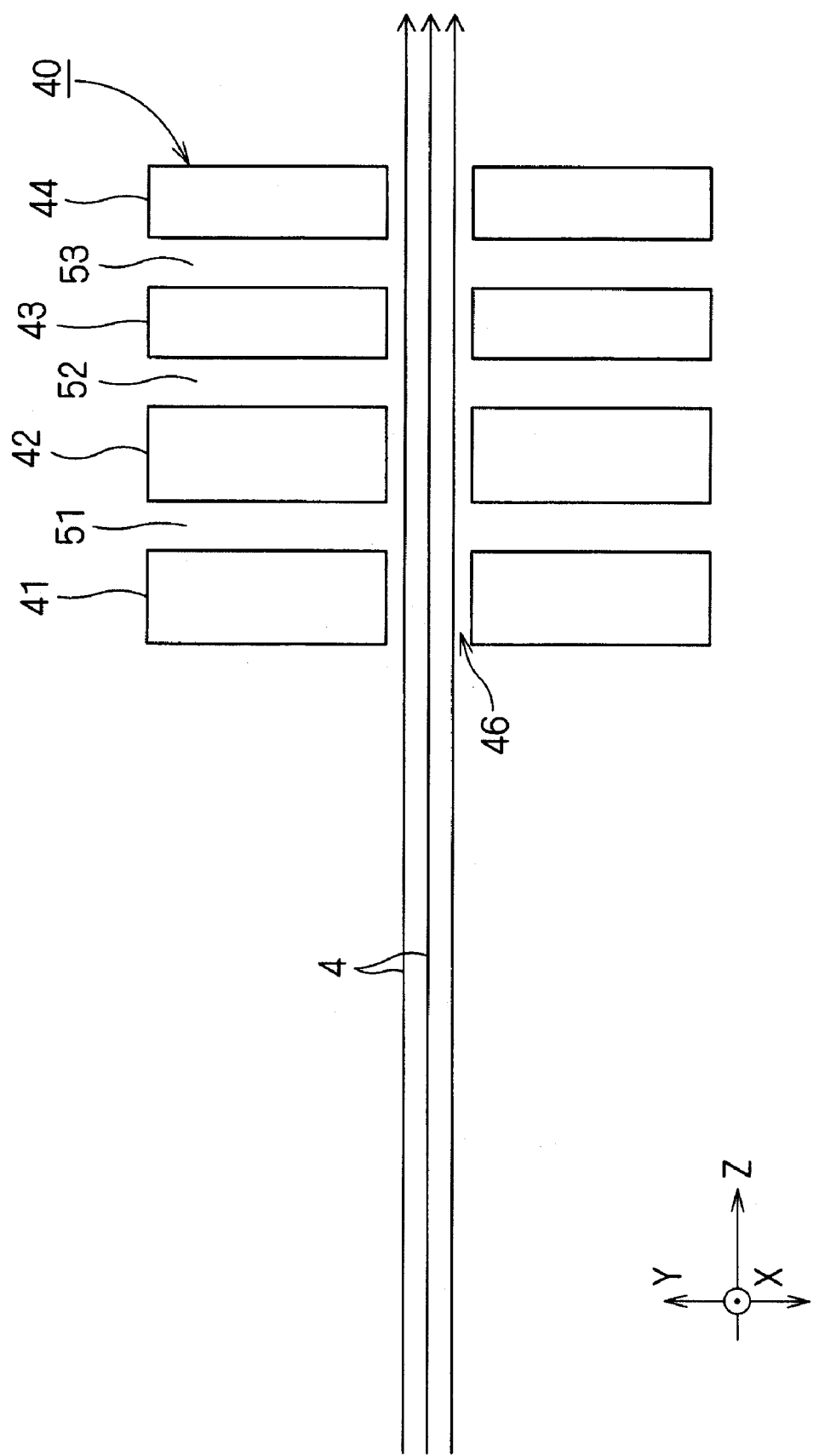
FIG. 5 is a YZ plan view showing the example of the state where the voltage is not applied to the unipotential lens shown in FIG. 3, as seen in the direction of the arrow Q in FIG. 3.

FIGS. 4 and 5 show a case where no voltage is applied to the unipotential lens 40. In each of the gaps 51 to 53, an electric field is not produced, and hence the orbit of the ion beam 4 is not changed in both of the XZ plane (see FIG. 4) and the YZ plane (see FIG. 5) (namely, the ion beam is emitted while maintaining the orbital direction at the incidence).

Figure 6:
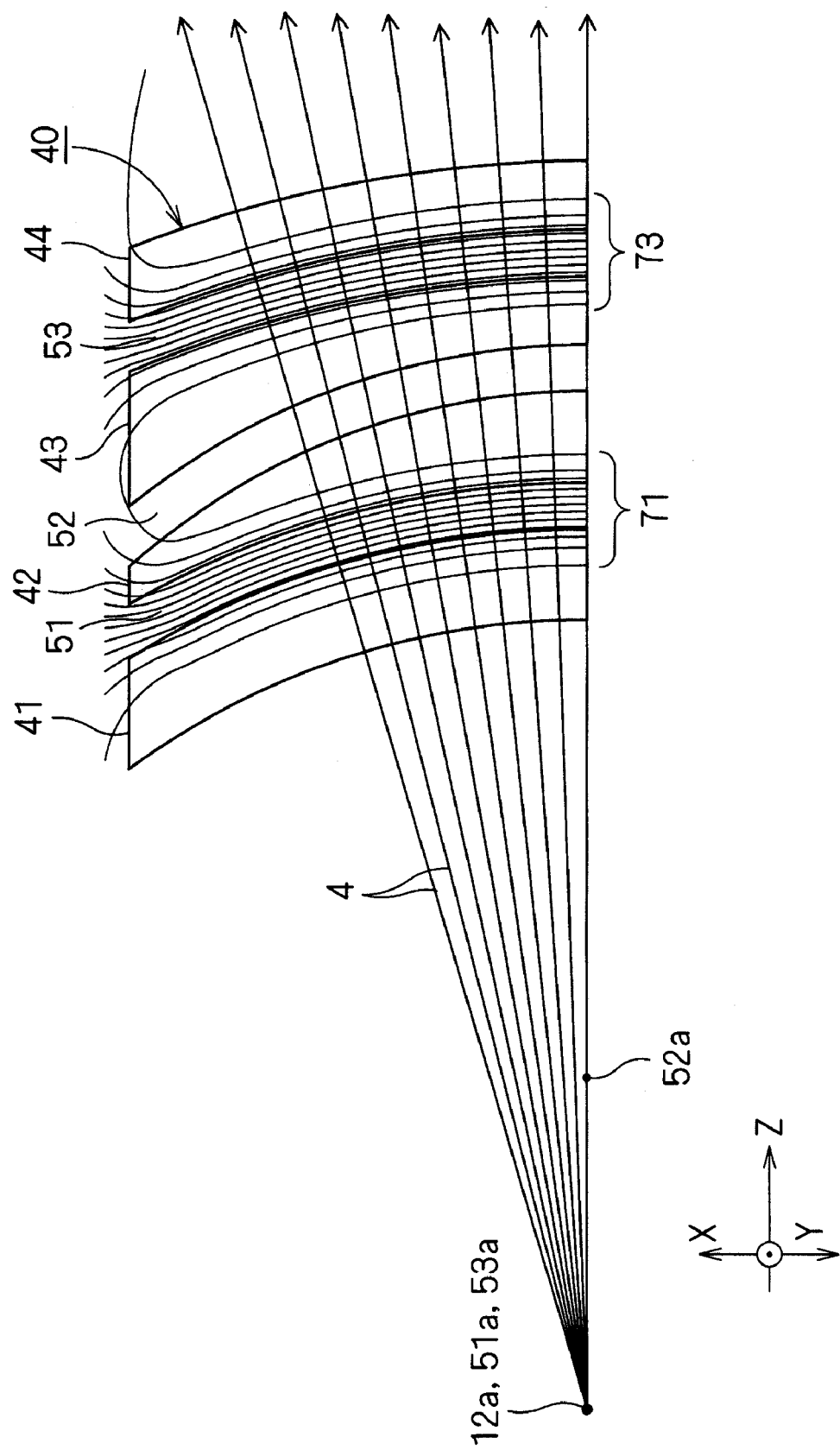
FIG. 6 is an XZ plan view showing an example of a state where voltages of V1=V2 are applied to the unipotential lens shown in FIG. 3, as seen in the direction of the arrow P in FIG. 3, together with equipotential lines.
Figure 7:
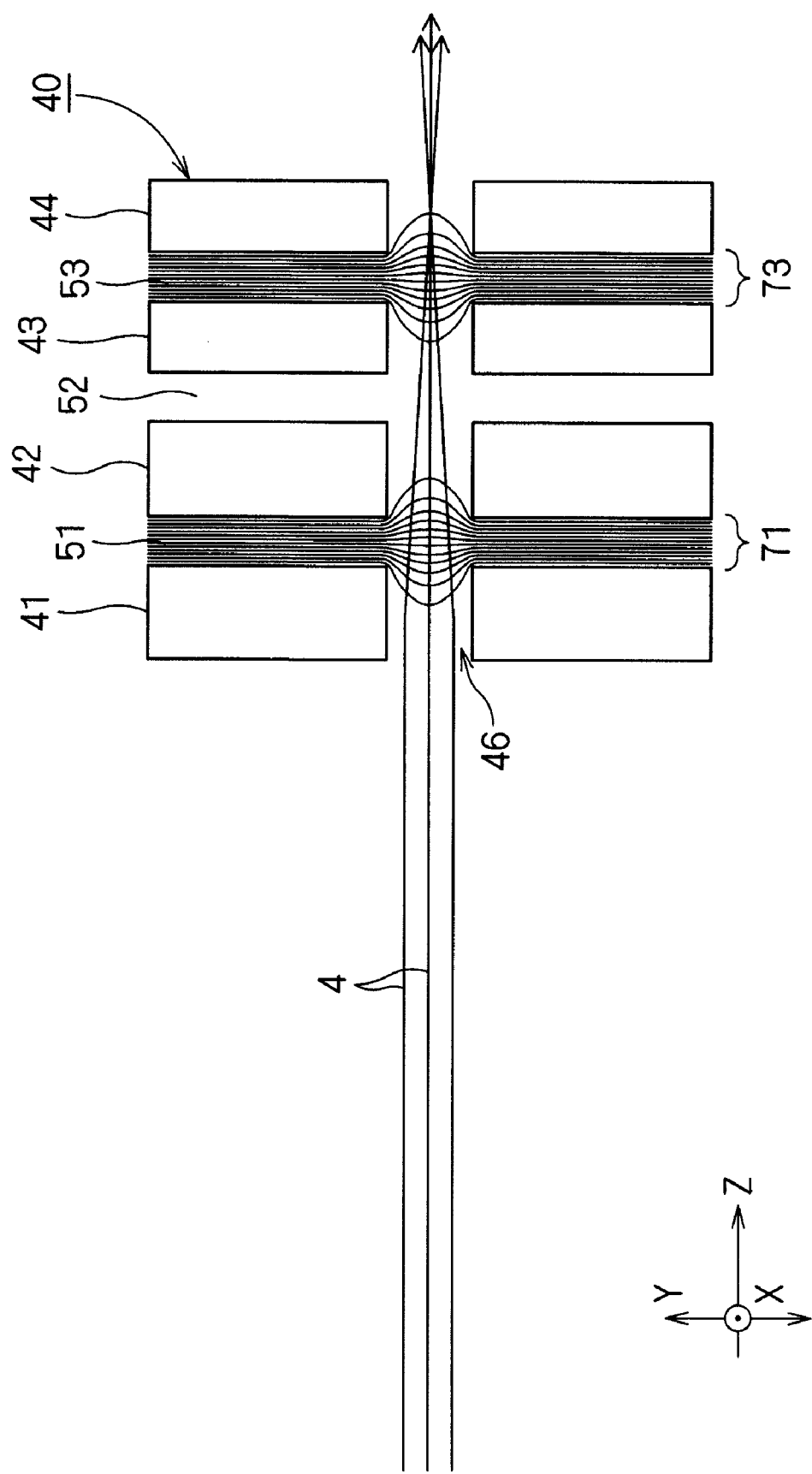
FIG. 7 is a YZ plan view showing the example of the state where the voltages of V1=V2 are applied to the unipotential lens shown in FIG. 3, as seen in the direction of the arrow Q in FIG. 3, together with equipotential lines.

FIGS. 6 and 7 show an example of a case where DC voltages $V_1$, $V_2$ of −10 kV (namely, $V_1 = V_2$) are applied to the second and third electrodes 42, 43, respectively, of the unipotential lens 40. Thus, an electric field is produced in the first and third gaps 51, 53. Several equipotential lines (which can also be described as equipotential surfaces) 71, 73 are shown. Since $V_1 = V_2$, an electric field is not produced in the second gap 52, and hence equipotential lines are not therefore illustrated in the second gap 52 of FIGS. 6 and 7. Similarly, equipotential lines are not shown in gaps in other examples where an electric field is not produced.

In the case of FIGS. 6 and 7, as described above, an angle is not formed in the XZ plane between the directions of the electric fields in the gaps 51, 53 and the traveling direction of the ion beam 4 (in other words, the ion beam 4 passes substantially perpendicularly to the equipotential lines 71, 73), and hence the orbit of the ion beam 4 in the XZ plane is not changed (see FIG. 6). In the YZ plane, the equipotential lines 71, 73 are expanded in a convex lens-like manner in the space 46 through which the ion beam 4 passes, and therefore the ion beam 4 is narrowed in the Y direction (see FIG. 7).

Figure 8:
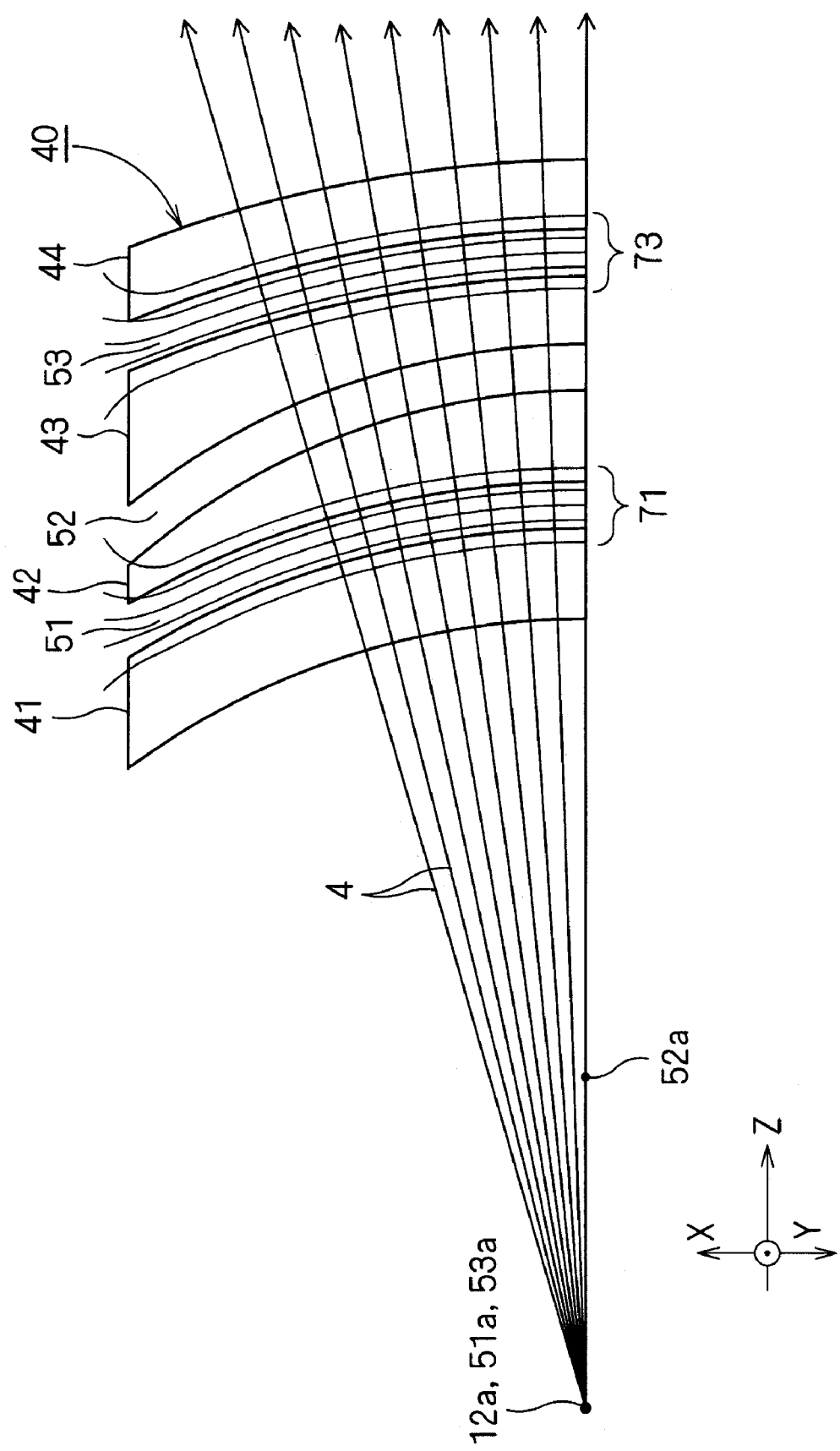
FIG. 8 is an XZ plan view showing a second example of a state where voltages of V1=V2 are applied to the unipotential lens shown in FIG. 3, as seen in the direction of the arrow P in FIG. 3, together with equipotential lines.
Figure 9:
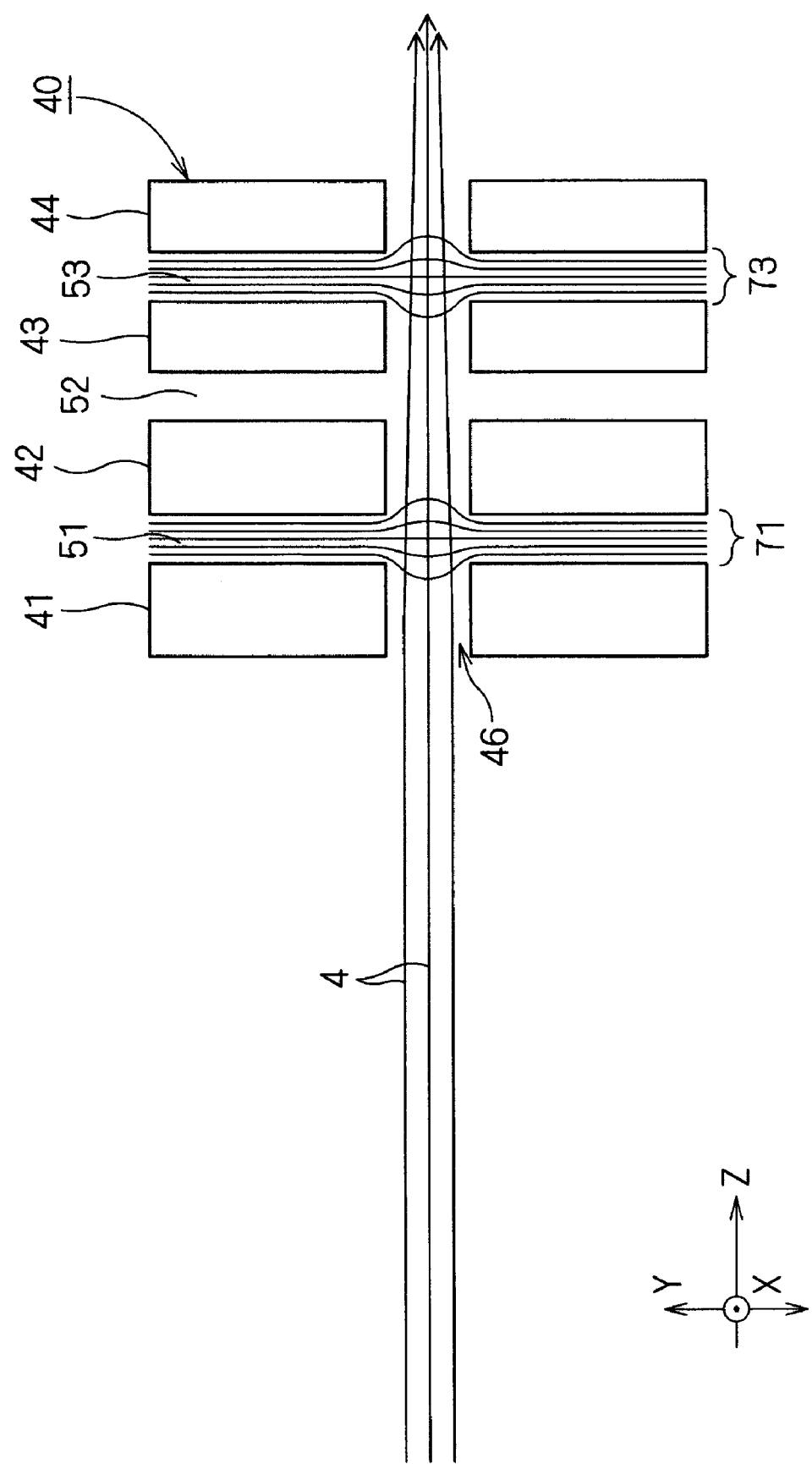
FIG. 9 is a YZ plan view showing the second example of the state where the voltages of V1=V2 are applied to the unipotential lens shown in FIG. 3, as seen in the direction of the arrow Q in FIG. 3, together with equipotential lines.

FIGS. 8 and 9 show an example of a case where the DC voltages $V_1$, $V_2$ of −5 kV (namely, $V_1 = V_2$) are applied to the second and third electrodes 42, 43, respectively, of the unipotential lens 40. In a similar manner with the case of FIG. 6, the orbit of the ion beam 4 in the XZ plane is not changed (see FIG. 8). Although, in a similar manner with the case of FIG. 7, the ion beam 4 is narrowed in the Y direction in the YZ plane (see FIG. 9), and the degree of narrowing is smaller as compared with the case of FIG. 7 because the absolute values of the DC voltages $V_1$, $V_2$ are smaller.

Figure 10:
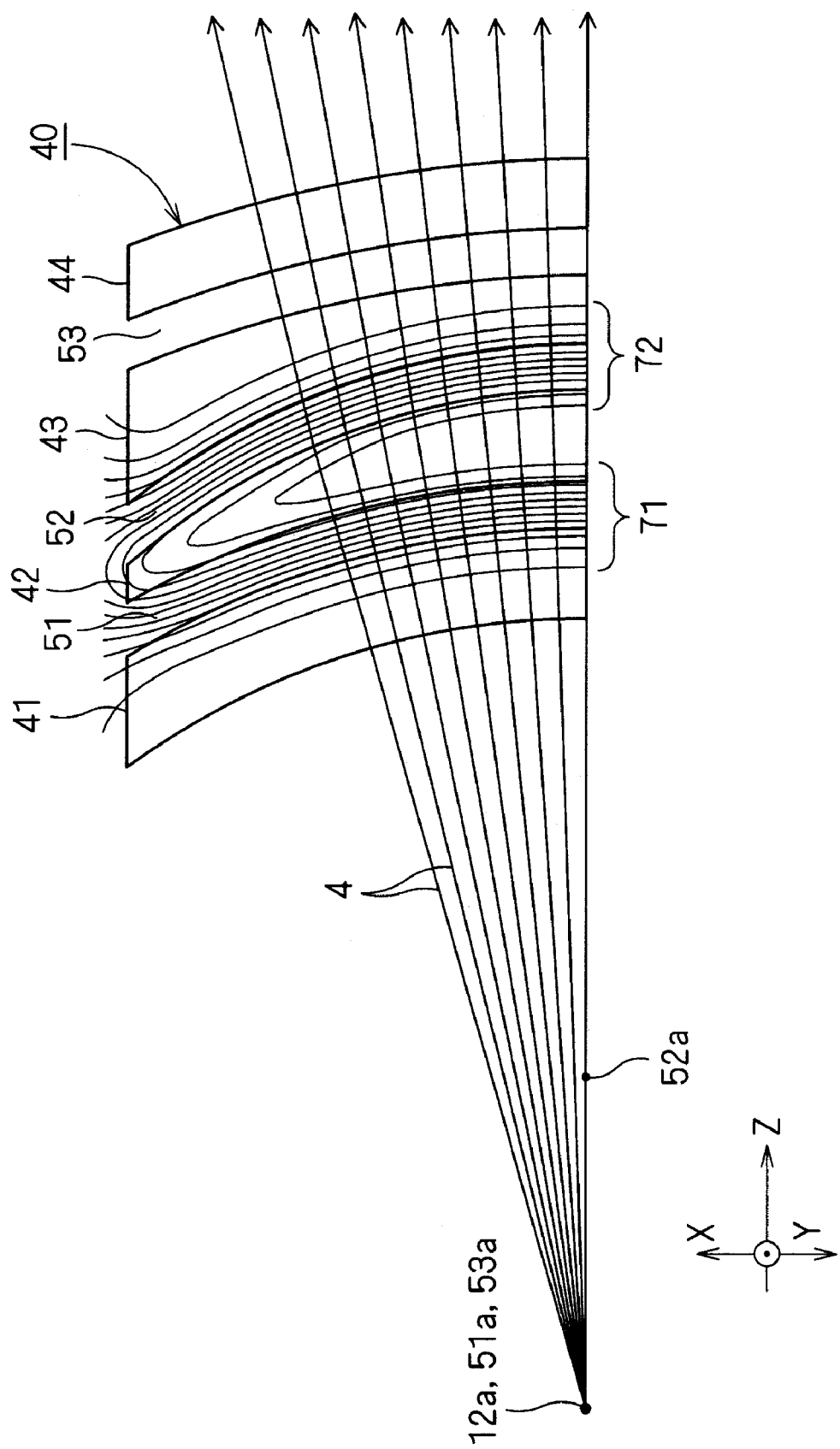
FIG. 10 is an XZ plan view showing an example of a state where voltages of V1<V2 are applied to the unipotential lens shown in FIG. 3, as seen in the direction of the arrow P in FIG. 3, together with equipotential lines.
Figure 11:
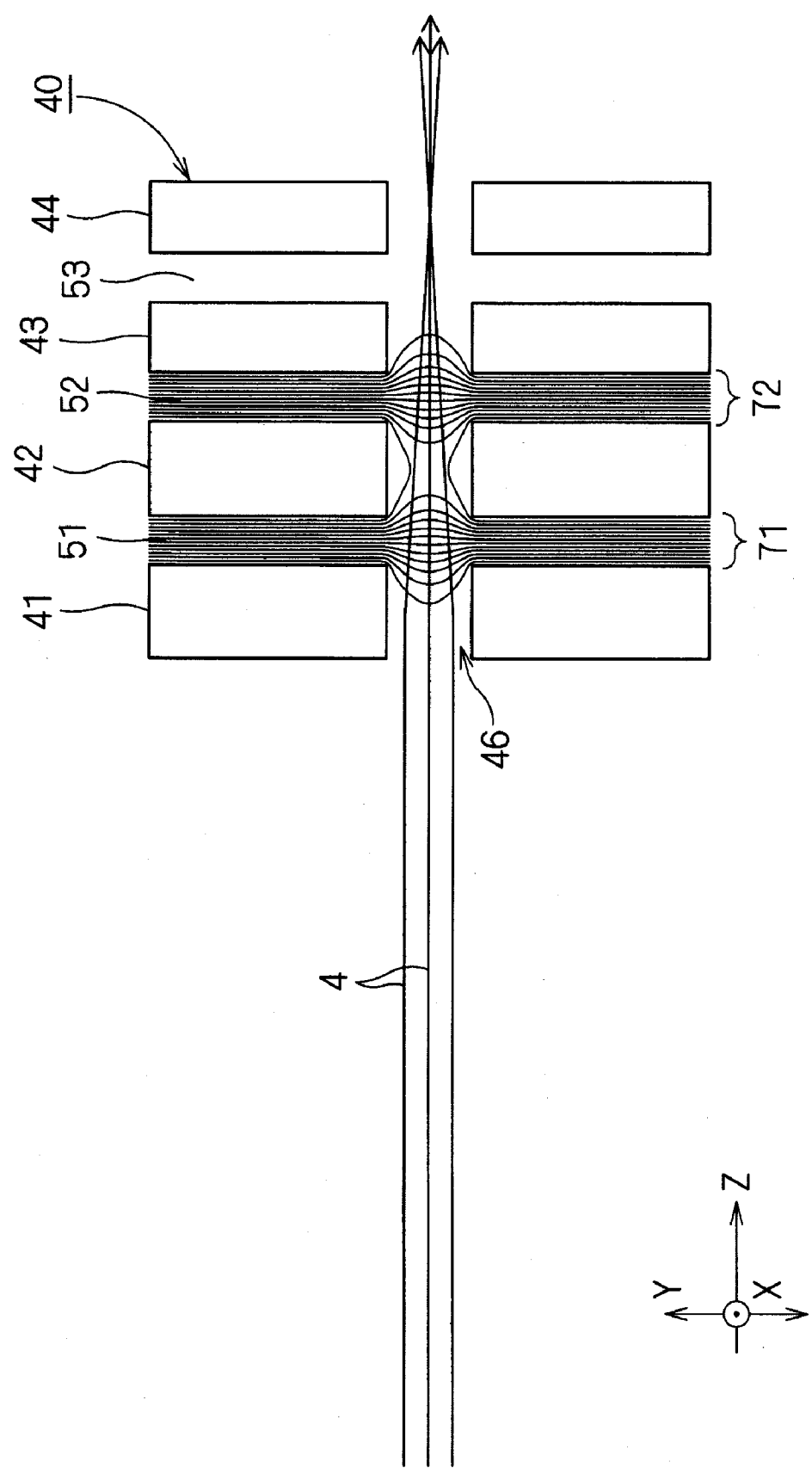
FIG. 11 is a YZ plan view showing the example of the state where the voltages of V1<V2 are applied to the unipotential lens shown in FIG. 3, as seen in the direction of the arrow Q in FIG. 3, together with equipotential lines.

FIGS. 10 and 11 show an example of a case where the DC voltages $V_1$, $V_2$ of −10 kV and 0 kV (namely, $V_1 < V_2$) are applied to the second and third electrodes 42, 43, respectively, of the unipotential lens 40. The orbit of the ion beam 4 in the XZ plane is bent toward the focusing direction by the electric field produced in the second gap 52 (several of the equipotential lines 72 of the electric field are shown) (see FIG. 10).

Figure 18:
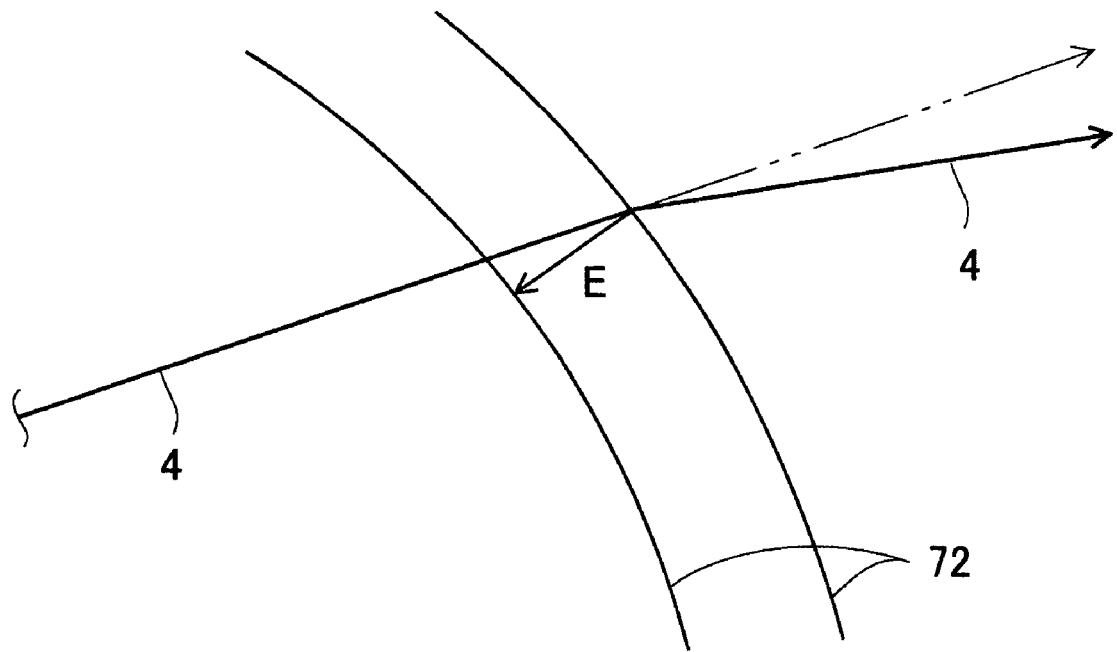
FIG. 18 is a view exaggeratingly showing an example of equipotential lines and a state of an ion beam in a vicinity of a second gap shown in FIG. 10 or 12.

This bend toward the focusing direction is caused by the phenomenon that, as exaggeratingly shown in FIG. 18, an electric field E which is directed more inwardly than the traveling direction of the incident ion beam 4 functions in the XZ plane, and the ion beam 4 is inwardly bent. In the YZ plane, the equipotential lines 71, 72 are expanded in a convex lens-like manner in the space 46 through which the ion beam 4 passes, and therefore the ion beam 4 is narrowed in the Y direction (see FIG. 11).

Figure 12:
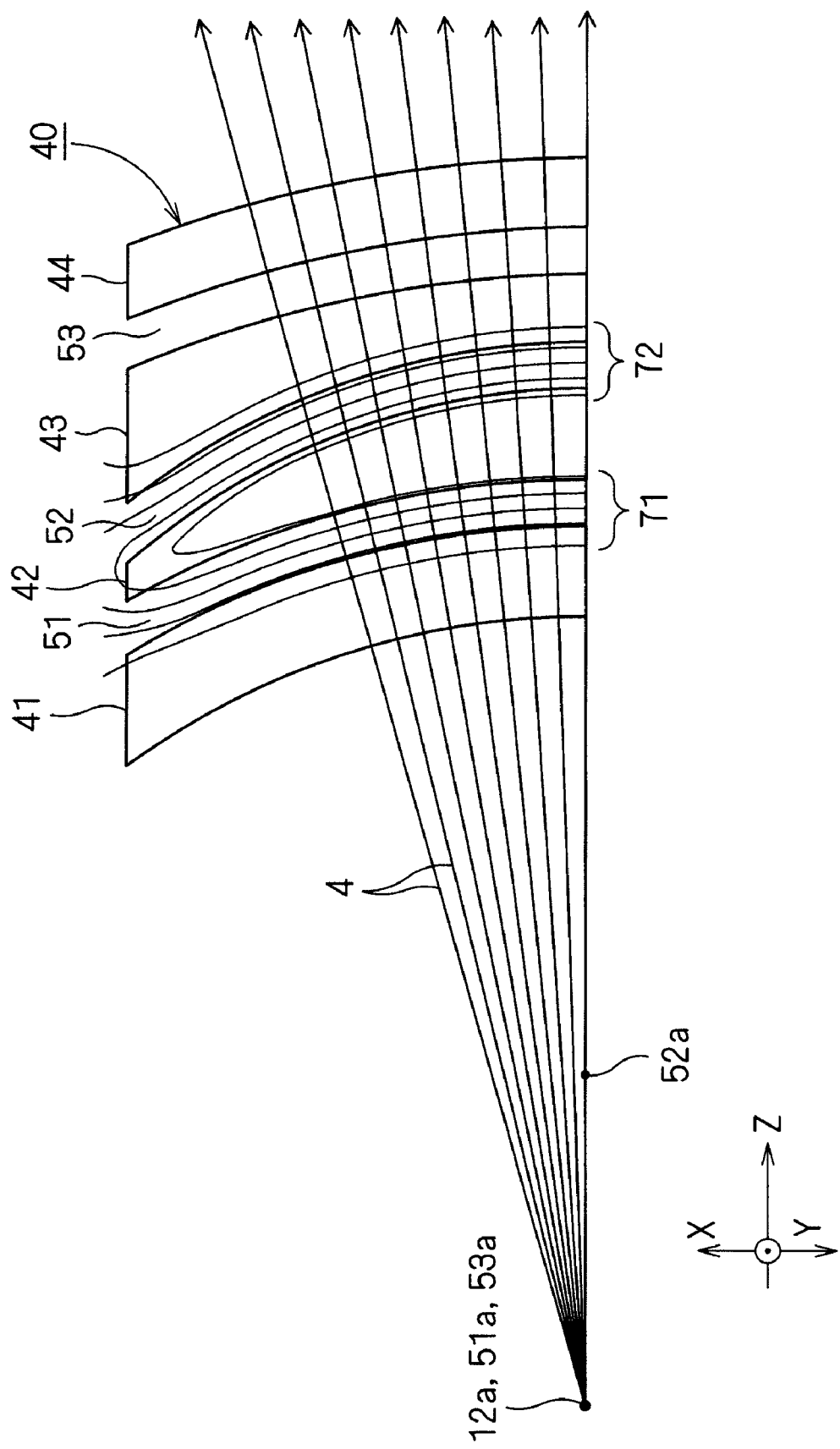
FIG. 12 is an XZ plan view showing a second example of the state where the voltages of V1<V2 are applied to the unipotential lens shown in FIG. 3, as seen in the direction of the arrow P in FIG. 3, together with equipotential lines.
Figure 13:
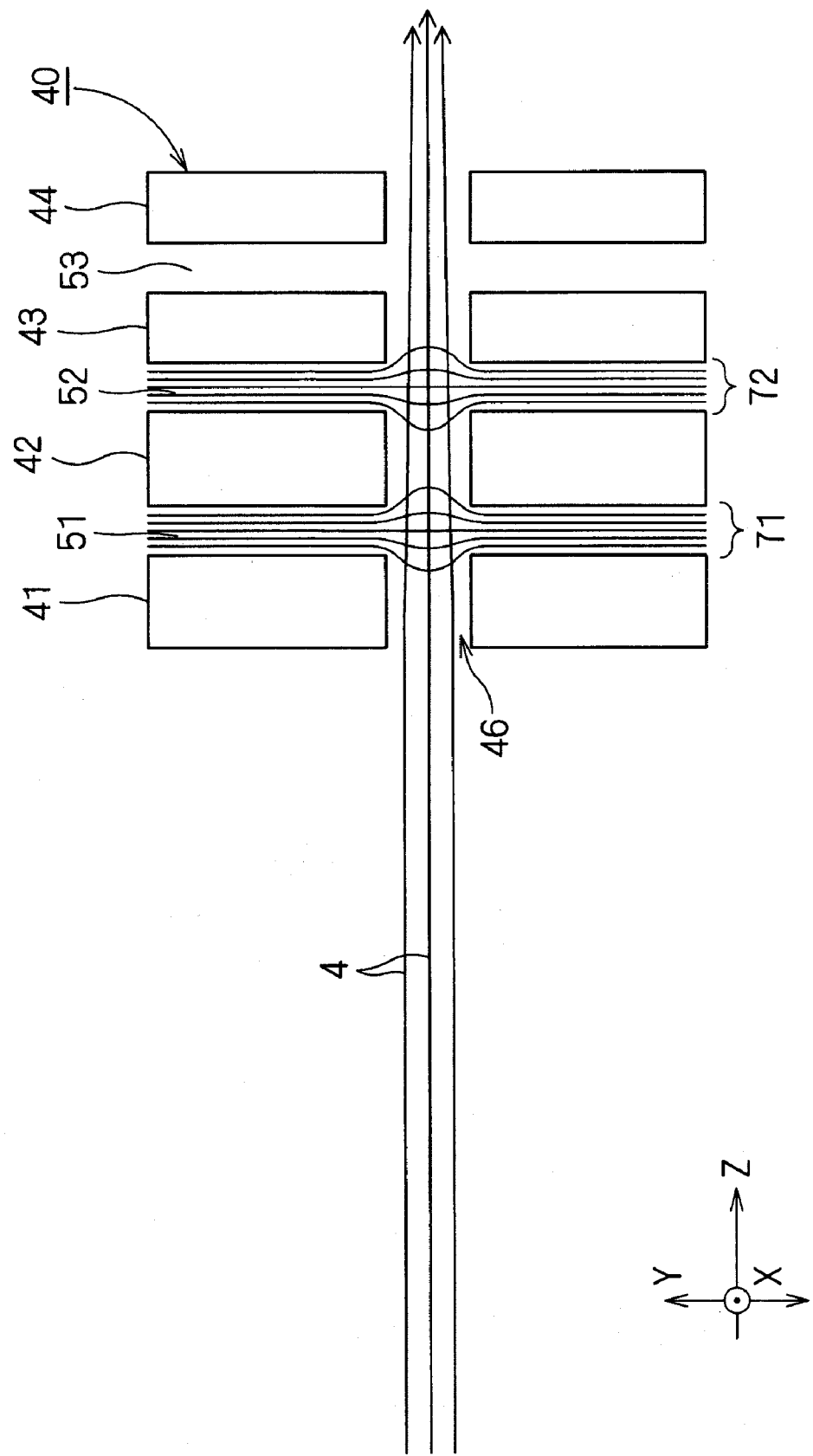
FIG. 13 is a YZ plan view showing the second example of the state where the voltages of V1<V2 are applied to the unipotential lens shown in FIG. 3, as seen in the direction of the arrow Q in FIG. 3, together with equipotential lines.

FIGS. 12 and 13 show an example of a case where DC voltages $V_1$, $V_2$ of −5 kV and 0 kV (namely, $V_1<V_2$) are applied to the second and third electrodes 42, 43, respectively, of the unipotential lens 40. In a similar manner with the case of FIG. 10, the orbit of the ion beam 4 in the XZ plane is bent toward the focusing direction (see FIG. 12). As compared with the case of FIG. 10, however, the electric field in the second gap 52 is weaker, and hence the degree of bending is less. Although, in a similar manner with the case of FIG. 11, the ion beam 4 is narrowed in the Y direction in the YZ plane (see FIG. 13), and the degree of narrowing is less than the case of FIG. 11 because the absolute value of the DC voltage $V_1$ is smaller.

Figure 14:
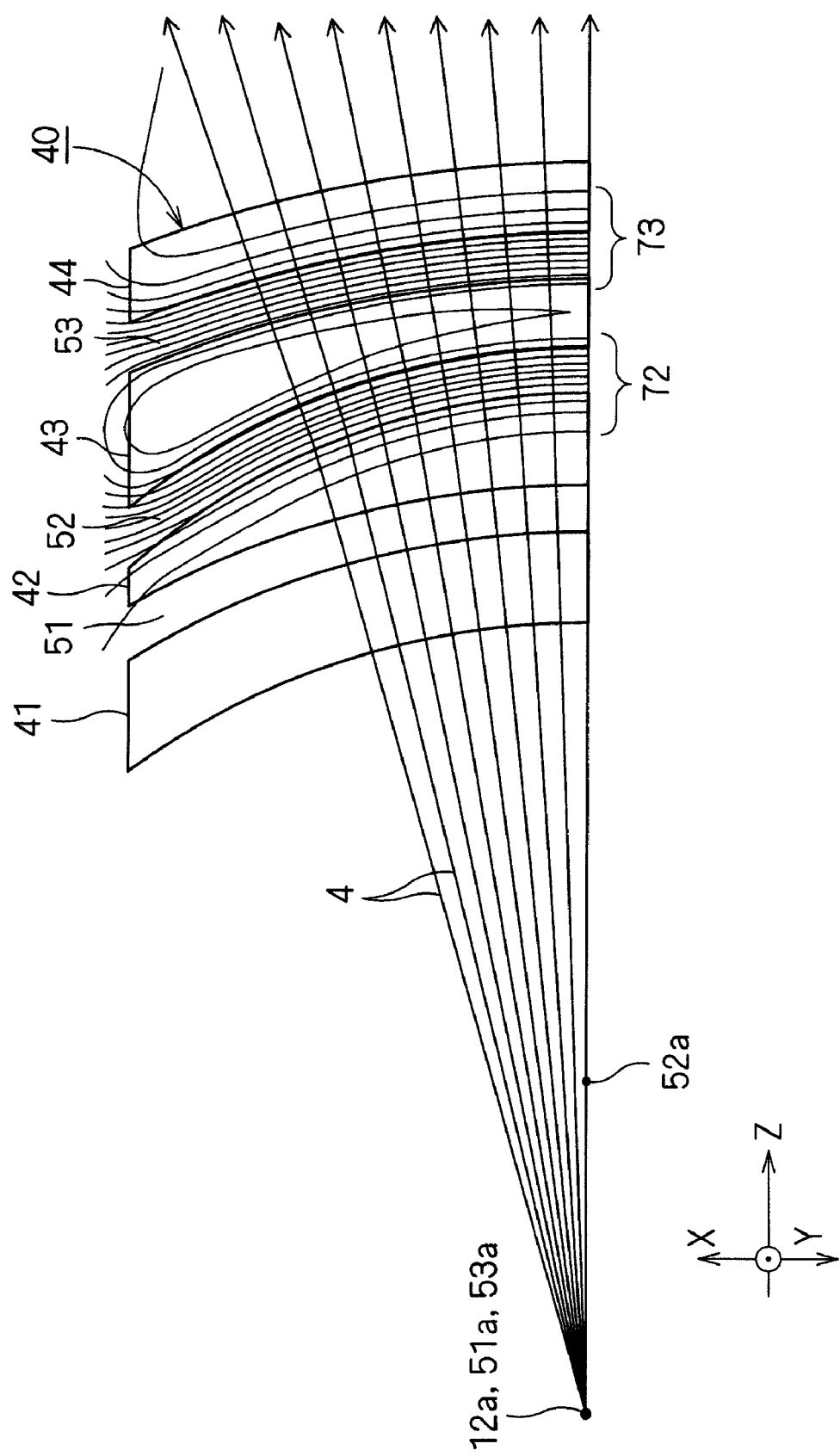
FIG. 14 is an XZ plan view showing an example of a state where voltages of V1>V2 are applied to the unipotential lens shown in FIG. 3, as seen in the direction of the arrow P in FIG. 3, together with equipotential lines.
Figure 15:
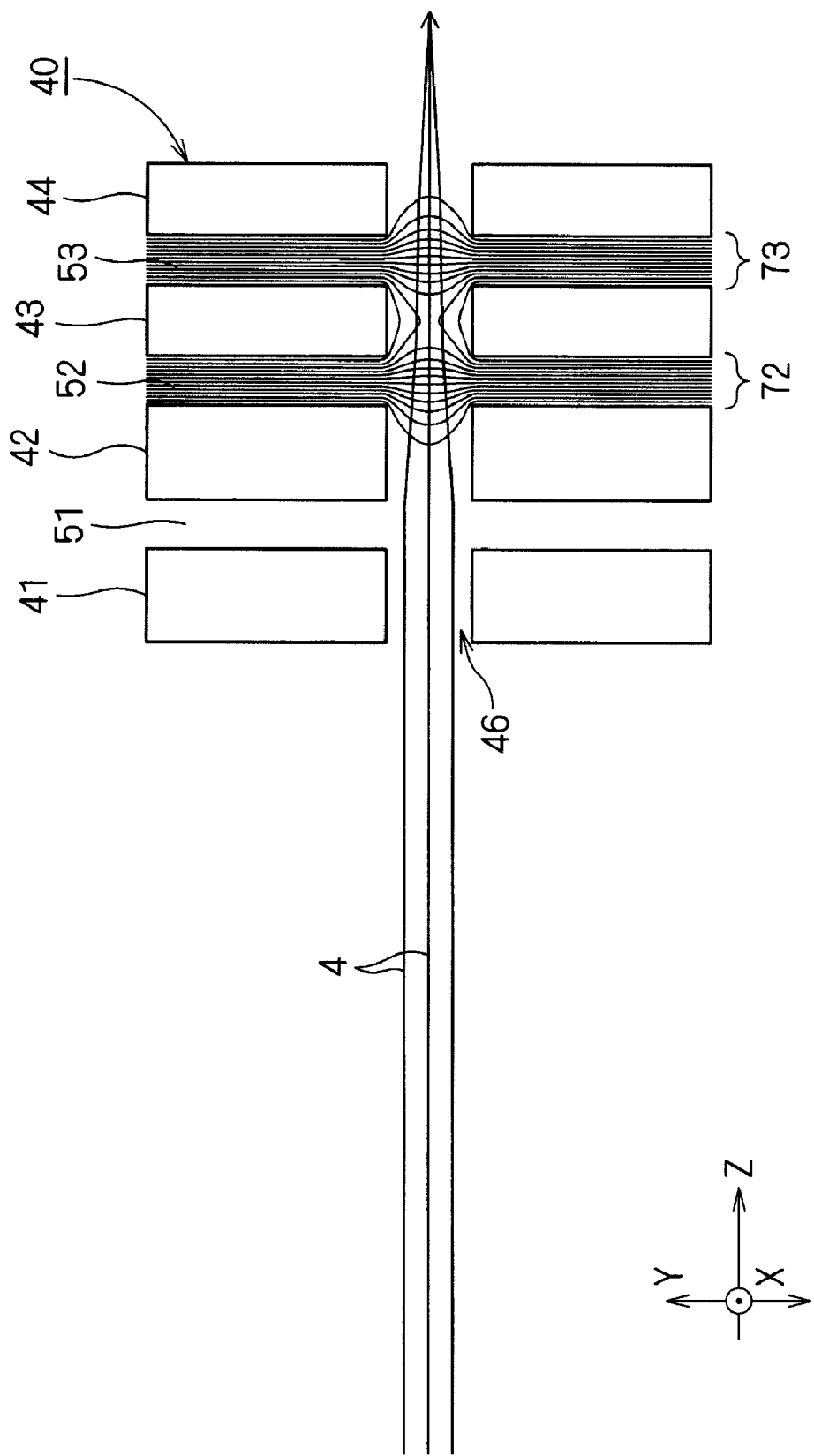
FIG. 15 is a YZ plan view showing the example of the state where the voltages of V1>V2 are applied to the unipotential lens shown in FIG. 3, as seen in the direction of the arrow Q in FIG. 3, together with equipotential lines.
Figure 19:
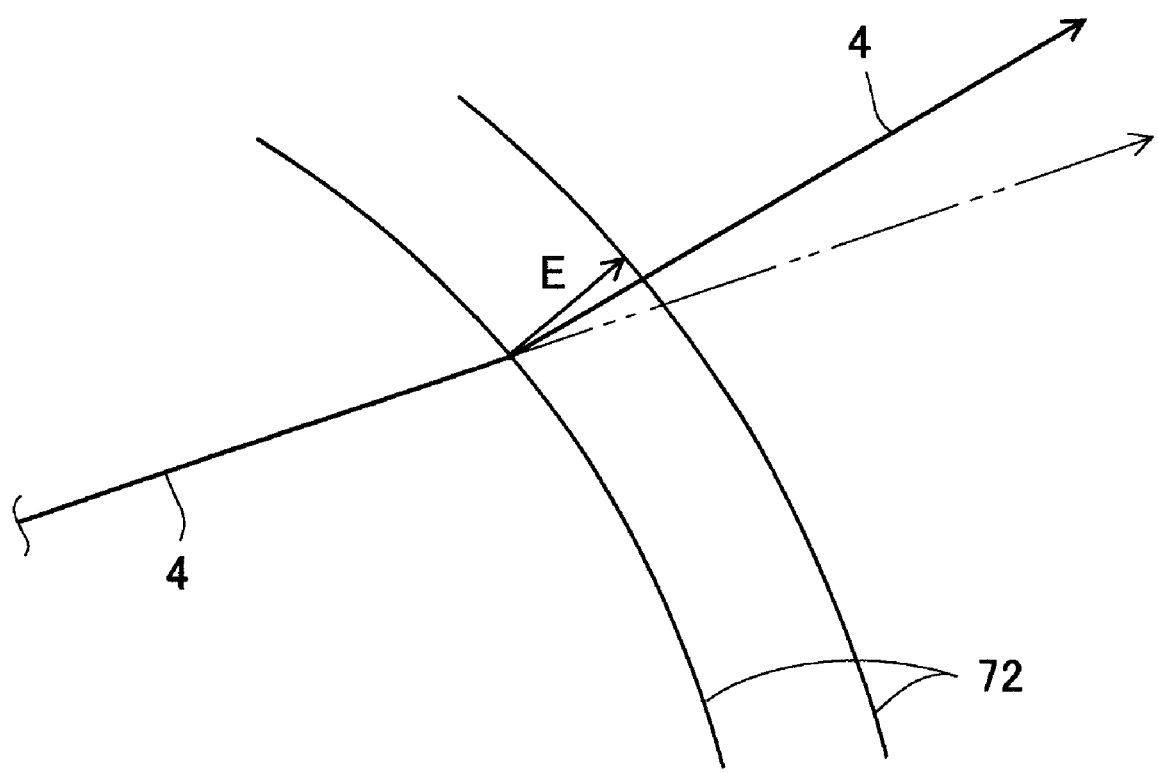
FIG. 19 is a view exaggeratingly showing an example of equipotential lines and a state of an ion beam in a vicinity of a second gap shown in FIG. 14 or 16.

FIGS. 14 and 15 show an example of a case where DC voltages $V_1$, $V_2$ of 0 kV and −10 kV (namely, $V_1>V_2$) are applied to the second and third electrodes 42, 43, respectively, of the unipotential lens 40. The orbit of the ion beam 4 in the XZ plane is bent toward the diverging direction by the electric field produced in the second gap 52 (several of the equipotential lines 72 of the electric field are shown) (see FIG. 14). This bend toward the diverging direction is caused by the phenomenon that, as exaggeratingly shown in FIG. 19, an electric field E which is directed more outwardly than the traveling direction of the incident ion beam 4 functions in the XZ plane, and the ion beam 4 is outwardly bent. In the YZ plane, the equipotential lines 72, 73 are expanded in a convex lens-like manner in the space 46 through which the ion beam 4 passes, and therefore the ion beam 4 is narrowed in the Y direction (see FIG. 15).

Figure 16:
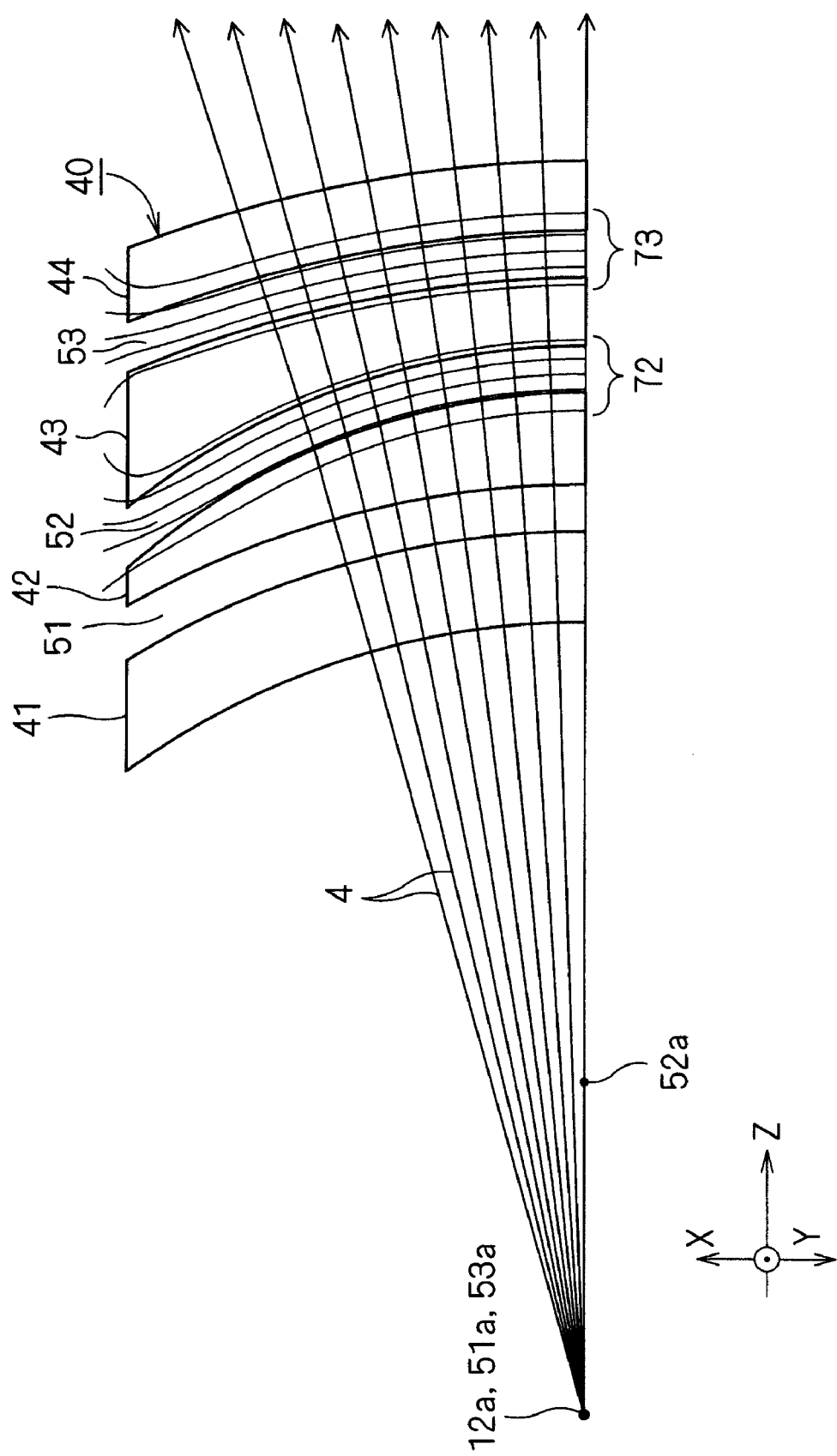
FIG. 16 is an XZ plan view showing a second example of the state where the voltages of V1>V2 are applied to the unipotential lens shown in FIG. 3, as seen in the direction of the arrow P in FIG. 3, together with equipotential lines.
Figure 17:
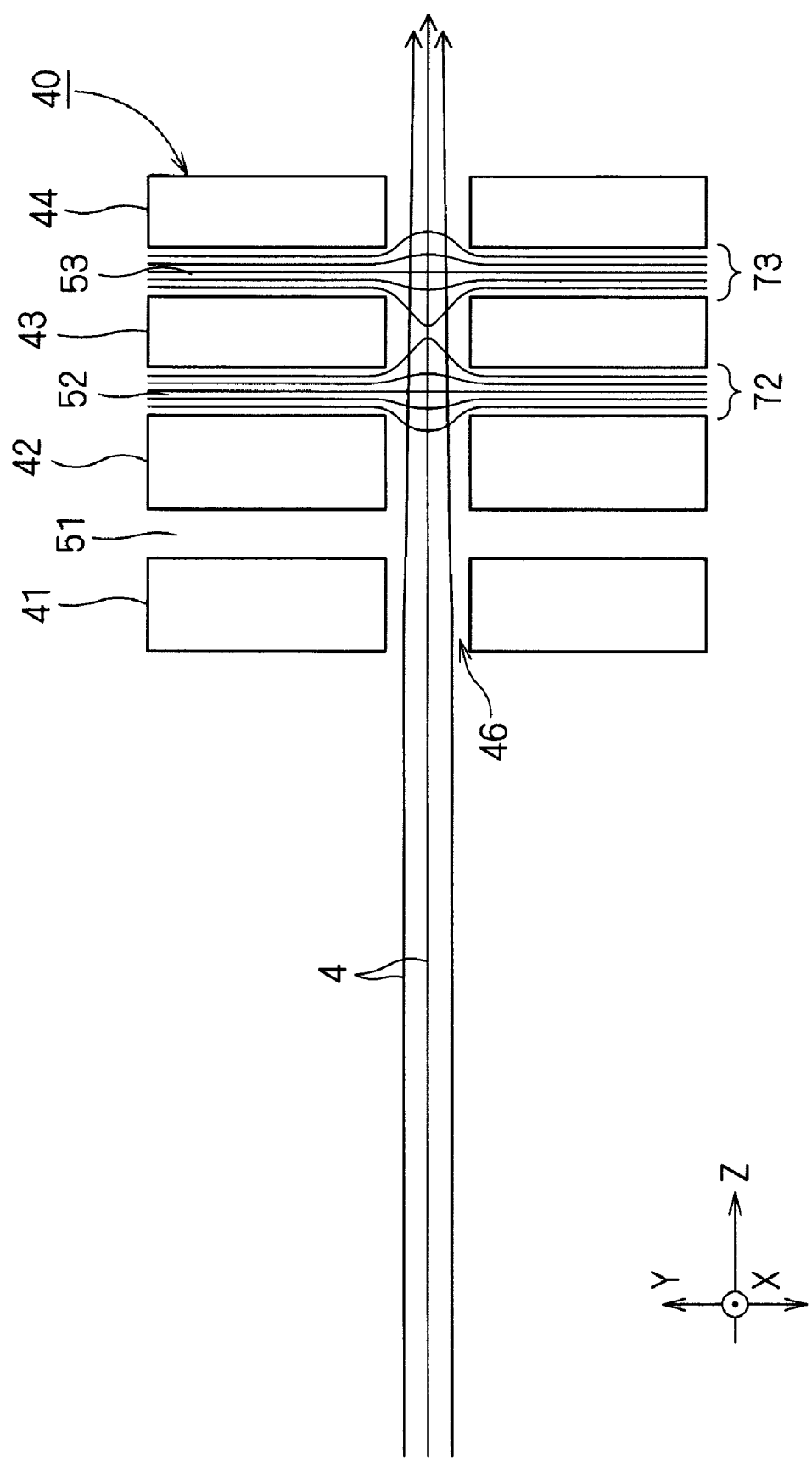
FIG. 17 is a YZ plan view showing the second example of the state where the voltages of V1>V2 are applied to the unipotential lens shown in FIG. 3, as seen in the direction of the arrow Q in FIG. 3, together with equipotential lines.

FIGS. 16 and 17 show an example of a case where DC voltages $V_1$, $V_2$ of 0 kV and −5 kV (namely, $V_1>V_2$) are applied to the second and third electrodes 42, 43, respectively, of the unipotential lens 40. In a similar manner with the case of FIG. 14, the orbit of the ion beam 4 in the XZ plane is bent toward the diverging direction (see FIG. 16). As compared with the case of FIG. 14, however, the electric field in the second gap 52 is weaker, and hence the degree of bending is less. Although, in a similar manner with the case of FIG. 15, the ion beam 4 is narrowed in the Y direction in the YZ plane (see FIG. 17), the degree of narrowing is less than the case of FIG. 15 because the absolute value of the DC voltage $V_2$ is smaller.

The states of the orbit of the ion beam 4 in the XZ plane in the above-described examples are collectively listed in the upper half of Table 1. The lower half of Table 1 will be described later.

TABLE 1

| Position of center 52a of curvature of second gap 52 | Relation between first and second DC voltages $V_1$, $V_2$ | Orbit of ion beam 4 in XZ plane |
|---|---|---|
| Downstream side of scan center 12a | $V_1 = V_2$ | Not changed |
| | $V_1 < V_2$ | Focusing direction |
| | $V_1 > V_2$ | Diverging direction |
| Upstream side of scan center 12a | $V_1 = V_2$ | Not changed |
| | $V_1 < V_2$ | Diverging direction |
| | $V_1 > V_2$ | Focusing direction |

As described above, when the DC voltages $V_1$, $V_2$ are applied to the second and third electrodes 42, 43, respectively, of the unipotential lens 40, the ion beam 4 can be narrowed in the Y direction, and the degree of narrowing can be adjusted depending on the levels of the DC voltages $V_1$, $V_2$. Moreover, when the DC voltages $V_1$, $V_2$ are adjusted, the orbit of the ion beam 4 in the XZ plane can be caused to be unchanged, or to be changed in the focusing or diverging direction, and the degrees of focusing and diverging can be adjusted depending on the levels of the DC voltages $V_1$, $V_2$.

A more specific example of the method in which the orbit of the ion beam 4 in the XZ plane is corrected in the unipotential lens 40 will be described.

In the downstream side of the beam collimator 14 shown in FIG. 2, the parallelism of the ion beam 4 in the XZ plane is detected by using an ion beam detector such as a Faraday cup. When the parallelism is within a threshold range, the DC voltages $V_1$, $V_2$ of $V_1=V_2$ are applied to the unipotential lens 40 so that the lens functions as a simple unipotential lens, i.e., so that the orbit of the ion beam 4 in the XZ plane is not changed. When the parallelism is not within the threshold range, the DC voltages $V_1$, $V_2$ of $V_1<V_2$ or $V_1>V_2$ are applied so that the diverging or focusing of the ion beam 4 in the XZ plane is corrected. The threshold range may be predetermined.

In the above examples, the position of the center 52a of curvature of the second gap 52 of the unipotential lens 40 is shifted from the position of the scan center 12a of the beam scanner 12 toward the downstream side. On the contrary, the position of the center 52a of curvature may be shifted from the position of the scan center 12a toward the upstream side in the ion beam traveling direction Z. In the case where the position is shifted toward the upstream side, the curvature of the second gap 52 is smaller than the curvatures of the first and third gaps 51, 53. In other words, the radius of curvature of the second gap 52 is larger than the radii of curvature of the first and third gaps 51, 53. Namely, the relationships which are contrary to relationships of the above described examples are obtained. As described later, therefore, also the function of bending the ion beam 4 in the XZ plane exhibits relationships opposite to the relationships of the above described examples.

An example of the case where the center 52a of curvature of the second gap 52 is shifted toward the upstream side will be described. Also in this case, the function of narrowing the ion beam 4 in the Y direction in the YZ plane is identical with the function of the above described examples, and therefore duplicated description is omitted.

In the case where the DC voltages $V_1$, $V_2$ of $V_1=V_2$ are applied to the second and third electrodes 42, 43, respectively, of the unipotential lens 40, the orbit of the ion beam 4 in the XZ plane is not changed similarly with the above-described cases of FIGS. 6 and 8.

Figure 20:
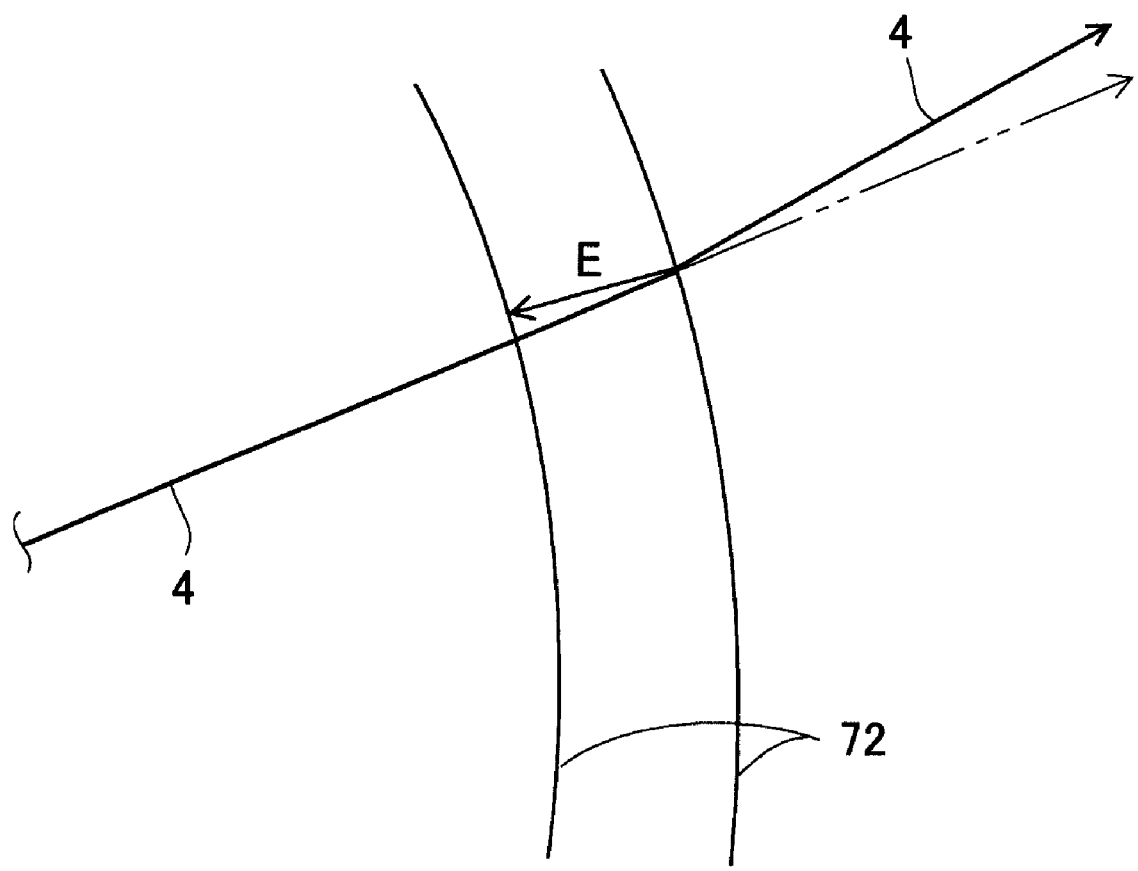
FIG. 20 is a view exaggeratingly showing an example of equipotential lines and a state of an ion beam in a XZ plane in a vicinity of a second gap in the case where a position of a center of curvature of the second gap is shifted from a position of a scan center of a beam scanner toward an upstream side, and V1<V2.

In the case where the DC voltages $V_1$, $V_2$ of $V_1<V_2$ are applied to the second and third electrodes 42, 43, respectively, of the unipotential lens 40, an electric field E which is directed more outwardly than the traveling direction of the incident ion beam 4 functions in the XZ plane, and the ion beam 4 is bent outwardly or i.e., in the diverging direction as exaggeratingly shown in FIG. 20.

In the case where the DC voltages $V_1$, $V_2$ of $V_1>V_2$ are applied to the second and third electrodes 42, 43, respectively, of the unipotential lens 40, an electric field E which is directed more inwardly than the traveling direction of the incident ion beam 4 functions in the XZ plane, and the ion beam 4 is inwardly or i.e., in the focusing direction as exaggeratingly shown in FIG. 21.

The above-described relationships are collectively listed in the lower half of Table 1.

As described above, the position of the center 52a of curvature of the second gap 52 of the unipotential lens 40 may be shifted from the position of the scan center 12a of the beam scanner 12 toward the downstream side or toward the upstream side in the ion beam traveling direction Z. However, it is advantageous to shift the position toward the downstream side. In this case, as compared with the case where the position is shifted toward the upstream side, the curvature of the second gap 52 is large, and the angle between the direction of the electric field in the second gap 52 and the incident ion beam 4 can be more easily increased. Therefore, the orbit of the ion beam 4 in the XZ plane which has passed through the second gap 52 can be easily changed, and hence the orbit deviation of the ion beam 4 in the XZ plane is more easily adjusted.

While the present invention has been shown and described with reference to contain exemplary embodiments thereof, it will be understood by those skilled in the art that various changes in form and details may be made therein without departing from the spirit and scope of the invention as defined by the appended claims.

What is claimed is:

1. An ion implanting apparatus comprising:
   a beam scanner;
   a beam collimator; and
   a unipotential lens which is disposed between said beam scanner and said beam collimator, and which includes first, second, third, and fourth electrodes spaced apart from one another in an ion beam traveling direction such that spaces between adjacent electrodes form first, second, and third gaps, respectively, said first and fourth electrodes being electrically grounded;
   wherein positions of centers of curvature of said first and third gaps of said unipotential lens coincide with a position of a scan center of said beam scanner, and
   wherein a position of a center of curvature of said second gap of said unipotential lens is shifted from the position of the scan center of said beam scanner toward a downstream or upstream side in the ion beam traveling direction.

2. The ion implanting apparatus according to claim 1, wherein when two directions that are orthogonal to each other in a plane that is orthogonal to a traveling direction Z of an ion beam are set as X and Y directions, respectively, said beam scanner scans the ion beam in the X direction, and said beam collimator bends the ion beam from said beam scanner so as to be substantially parallel to a predetermined reference axis in an XZ plane, thereby forming the ion beam as a parallel beam.

3. The ion implanting apparatus according to claim 2, wherein a shape of each of said first, second and third gaps in the XZ plane is arcuate.

4. The ion implanting apparatus according to claim 2, wherein each of said first, second, third, and fourth electrodes of said unipotential lens comprises two electrodes which are opposed to each other in the Y direction across a space through which the ion beam passes, and which are at a same potential.

5. The ion implanting apparatus according to claim 1, further comprising;
   a voltage-variable DC power source connected to said second and third electrodes of said unipotential lens, wherein
   the voltage-variable DC power source applies first and second DC voltages to said second and third electrodes.

6. An ion implanting apparatus comprising:
   a beam scanner;
   a beam collimator; and
   a unipotential lens which is disposed between said beam scanner and said beam collimator, and which includes first, second, third, and fourth electrodes spaced apart from one another in an ion beam traveling direction such that spaces between adjacent electrodes form first, second, and third gaps, said first and fourth electrodes being electrically grounded;
   wherein said electrodes have a shape which is arcuately curved in a XZ plane so that the first, second and third gaps are arcuate gaps, respectively,
   wherein positions of centers of curvature of said first and third gaps of said unipotential lens coincide with a position of a scan center of said beam scanner, and
   wherein a position of a center of curvature of said second gap of said unipotential lens is shifted from the position of the scan center of said beam scanner toward a downstream or upstream side in the ion beam traveling direction.

7. A method of correcting a orbit of a ion beam using the ion implanting apparatus of claim 1, the method comprising,
   detecting a parallelism of the ion beam in an XZ plane;
   when the parallelism is within a threshold range, applying first DC voltages to the second and third unipotential lenses, respectively, so that the orbit of the ion beam in the XZ plane is not changed, and
   when the parallelism is not within the threshold range, applying second DC voltages to the second and third unipotential lenses, respectively, so that the orbit of the ion beam in the XZ plane is corrected.

8. The method of correcting the orbit of the ion beam according to claim 6,
   wherein the parallelism is within the threshold range, the first and second DC voltages applied to the second and third unipotential lenses are the same respectively.

* * * * *